United States Patent
Mohri et al.

(10) Patent No.: US 8,481,441 B2
(45) Date of Patent: Jul. 9, 2013

(54) ANODIC BONDABLE PORCELAIN AND COMPOSITION FOR THE PORCELAIN

(75) Inventors: Mamoru Mohri, Ishikawa (JP); Naoki Kidani, Ishikawa (JP)

(73) Assignee: Nikko Company, Ishikawa (JP)

( * ) Notice: Subject to any disclaimer, the term of this patent is extended or adjusted under 35 U.S.C. 154(b) by 361 days.

(21) Appl. No.: 13/003,730

(22) PCT Filed: Aug. 4, 2009

(86) PCT No.: PCT/JP2009/064079
§ 371 (c)(1),
(2), (4) Date: Jan. 11, 2011

(87) PCT Pub. No.: WO2010/016598
PCT Pub. Date: Feb. 11, 2010

(65) Prior Publication Data
US 2011/0108931 A1    May 12, 2011

(30) Foreign Application Priority Data
Aug. 6, 2008  (JP) ................ 2008-203425

(51) Int. Cl.
*C04B 35/19*    (2006.01)
(52) U.S. Cl.
USPC ............ 501/128; 501/7; 428/210; 428/701; 428/702

(58) Field of Classification Search
USPC ................ 501/7, 128; 428/210, 701, 702
See application file for complete search history.

(56) References Cited

U.S. PATENT DOCUMENTS

| 6,809,424 | B2 | 10/2004 | Pike et al. | |
| 7,276,460 | B2 * | 10/2007 | Kidani et al. | 501/108 |
| 7,300,897 | B2 * | 11/2007 | Kidani et al. | 501/108 |

FOREIGN PATENT DOCUMENTS

| JP | 2003-238202 A | | 8/2003 |
| JP | 2004-537156 A | | 12/2004 |
| JP | 2007284327 | * | 1/2007 |
| WO | 2005/042426 A2 | | 5/2005 |

OTHER PUBLICATIONS

E.Müller, et al, "Development and Processing of an Anodic Bondable LTCC Tape", IMAPS EMPC, 2005.

* cited by examiner

*Primary Examiner* — Karl Group
(74) *Attorney, Agent, or Firm* — Sugrhrue Mion, PLLC

(57) ABSTRACT

An anodic bondable low-temperature fired porcelain having high-strength and low-thermal-expansion, wherein a conductive ion during anodic bonding is an Li ion, containing a complex oxide having a composition represented by the following formula:

$$(1-x)(\alpha Li_2O\text{-}\beta MgO\text{-}\gamma Al_2O_3\text{-}\delta Si_2O_2) \cdot xBi_2O_3 \qquad (1)$$

where x represents a mass ratio of 0.01 to 0.1, and α, β, γ and δ have a molar ratio of 2 to 5:1 to 2:1 to 2:7 to 17.

12 Claims, 1 Drawing Sheet

Production of MEMS → Dicing → Die bond / Wire bond → Lid sealing

Taking out a chip

ANODIC BONDABLE PORCELAIN AND COMPOSITION FOR THE PORCELAIN

FIELD OF THE INVENTION

The present invention relates to an anodic bondable low-temperature fired porcelain having high-strength and low-thermal-expansion and a composition for the porcelain. More specifically, the present invention relates to a wiring substrate formed by molding and firing the composition, preferably, a fired substrate suitable as a hermetically sealed through wiring substrate of micro electro mechanical systems (MEMS), and an MEMS element formed by wafer-level packaging using the hermetically sealed through wiring substrate.

BACKGROUND OF THE INVENTION

Anodic bonding is a method of bonding glass to silicon by bringing glass containing alkali metal typified by borosilicate glass into contact with silicon, heating the glass and silicon to a temperature at which alkali metal ions such as a sodium ion in the glass can easily move, connecting a silicon side to a positive electrode and a glass side to a negative electrode, and applying a D.C. voltage of about hundreds to thousands of bolts. Non-cross-linked oxygen ions generated when the alkali metal ions move to the negative electrode side and silicon attract each other electrostatically to cause a chemical bond at a glass-silicon interface, thereby strong and highly-reliable bonding is obtained, which is frequently used for a mounting technology such as a pressure sensor and an acceleration sensor.

The MEMS has been used for sensors in automobiles, game appliances and the like after the research-and-development stage, and is entering the stage of practical use and spreading period. In order that the MEMS is mounted on communication equipment such as a cellular phone, it is considered to be important to realize the reduction in size and profile, and the enhanced performance, as well as the reduction in cost. Actually, about 80% of the cost of the MEMS is considered to be charge for mounting using a package and for an inspection, and thus, the package mounting is a serious problem in the reduction in size and profile and the enhancement of performance.

The MEMS that is currently used is mounted on a package as shown in FIG. 1, and the production process thereof is as follows.

1) The MEMS element produced in a wafer state is diced into chips.

2) A chip is taken out of the wafer and attached to a package substrate via a binding agent, and an electrode of the MEMS chip is connected to an electrode of the package via a metal wire.

3) The MEMS chip has a moving portion, so the MEMS chip is sealed air-tightly by covering the package with a lid.

According to the production method by package mounting, there area number of steps as described above, and in addition, the MEMS chip with the moving portion is handled without protection, so the MEMS chip is easily broken, which causes the degradation in yield. Further, a package is larger than a chip, which is a main factor that inhibits the reduction in size and profile.

As means for solving the above problems, wafer-level mounting has been developed, and the mounting method is composed of a process as shown in FIG. 2. If a silicon wafer with a MEMS element formed thereon and a mounting substrate can be directly attached to each other and air sealed, the assembly process is simplified greatly. The bonding not only eliminates the handling of a chip with a moving portion, which is a main factor of degrading yield, but also enables the reduction in size and profile of the MEMS. Further, the number of chips that can be obtained from one wafer increases, which has a large effect on the reduction in cost. In order to realize the wafer-level mounting, a through wiring mounting substrate for taking a signal out of the air-tightly sealed MEMS chip is required. This is because it is necessary that an electrode on the mounting substrate side bonded to the electrode of the MEMS device is led to the reverse surface. As a material for the through wiring substrate, glass or silicon with a through-hole filled with a conductive material is used.

When drilling used for opening a hole in glass is employed, the shape of a hole is satisfactory; however, there is a limit in the reduction in a hole size and a pitch. Further, when the number of holes in the wafer increases, it becomes difficult to grind the wafer, so there is a limit in the number of holes. Further, although a number of holes can be concurrently formed by sandblasting, the hole shape is poor and there is also a limit in the hole size and pitch. After the hole opening, a through wiring treatment is performed, which requires a complicated step. In an example put into practical use, the metallization of a hole side surface, the insertion of a metal core material for conduction, the flowing of a wax material, and the mirror polishing are performed in the stated order. Thus, sandblasting requires a high cost and is limited in miniaturization.

Silicon can be subjected to fine hole opening using a Deep RIE apparatus; however, the Deep RIE apparatus is very expensive and takes a long treatment time. A through wiring substrate is produced in complicated steps similarly to the case of glass after the hole opening. The oxidation for insulation, the formation of a seed layer for electroplating, the hole plugging by electroplating, and the mirror polishing are performed in the stated order. Further, because silicon is not anodic bondable, silicon and a silicon MEMS wafer are bonded to each other by a plasma metal activation method or bonding at normal temperature. However, the bonding apparatus is quite expensive and takes a long bonding time. Thus, although a substrate having fine holes can be produced, there is a problem in that the considerable capital investment is required, and cost is high.

As described above, materials using glass and silicon have been considered as a material for a wafer-level mounting substrate. However, with those materials, the step of forming through wiring is complicated and its cost is high, and furthermore, a multi-layered wiring cannot be formed, so there is no degree of freedom in design.

As the multi-layered wiring substrate, a low-temperature co-fired ceramics (LTCC) substrate has been known widely. The LTCC is a ceramic multi-layered substrate used frequently in high-frequency components and a module substrate for cellular phones and automobile parts. The LTCC is a substrate that can be used for producing a through wiring and multi-layered wiring with good productivity at a low cost, and furthermore, can contain passive components such as a capacitor and a coil in the substrate.

The LTCC substrate is generally produced by adding an organic binder to a mixed material, in which glass or the like is added to a ceramics material, forming the mixture into green sheets, opening through-holes in the sheet for connecting vertically, printing a paste containing a conductor into the through-holes and the surfaces of the green sheets, placing the green sheets exactly on top of the other, laminating the resultant by heating under pressure to integrate the resultant, and firing the resultant.

Holes can be punched in the LTCC substrate easily with high productivity by punching the green sheets with a punch pin or subjecting the green sheets to a laser treatment. Further, the green sheets with punched holes can be filled with the conductor easily by screen printing that is a general-purpose technology.

It is difficult to form a multi-layered wiring with glass or silicon. However, the LTCC substrate is produced by laminating a number of green sheets, so a multi-layered substrate can be obtained easily. Because wiring can be redesigned inside the layers, a degree of freedom in wiring design increases without being concerned about the electrode pad position on the MEMS chip side and the electrode pad position on the secondary mounting side. If required, as commonly-performed in the LTCC substrate, the function of the LTCC substrate may be enhanced by allowing the LTCC substrate to contain passive components such as a capacitor and a coil.

Thus, compared with glass or silicon that is a material for an MEMS through wiring electrode substrate, which is currently used, the LTCC substrate can be produced easily and reduced in cost.

However, the thermal expansion coefficient of the LTCC substrate is not matched with that of silicon, and a method of bonding to silicon is limited to a method using an inclusion such as soldering, a wax material, glass or an organic adhesive. Therefore, it has been difficult to adopt the LTCC substrate in view of the reliability in bonding to a wafer.

In order to use the LTCC substrate as a substrate for MEMS wafer-level mounting, it is necessary to develop a material to have a bonding technology that has not been able to be used with respect to the LTCC substrate available, and such a material is an anodic bondable material. The anodic bonding is a method used for bonding silicon to a mounting substrate made of a glass substrate. The method, being simple in production facilities, attains a high bonding yield and high reliability. The LTCC substrate and other materials are bonded to each other by a method using a material having an adhesive ability such as Au/Sn eutectic soldering in most cases. Regarding the anodic bonding, recently, only a material capable of being assembled by anodic-bonding using sodium ions as conductive ions has been disclosed in Germany (WO 2005/042426).

WO 2005/042426 describes a glass ceramics (LTCC) capable of being assembled with silicone by anodic-bonding, and specifically, a low-temperature fired ceramics using ceramic powder made of glass powder containing an alkali metal, alumina, cordierite and/or silica glass. As the glass powder, borosilicate glass containing about 2.6 wt % of Na content is used, and the coefficient of thermal expansion of the low-temperature fired ceramics is 3.4 ppm/° C. that is substantially equal to that of silicon. The low-temperature fired ceramics have a composition as follows: 60 to 70 wt % of borosilicate glass; 10 to 20 wt % of alumina; 8 to 25 wt % of cordierite or silica glass, with the Na content of 1.5 wt % or more.

A heating treatment is required for bonding a material to silicon. Therefore, if the material does not have a thermal expansion coefficient similar to that of silicon, there is a possibility that the electrode position of the MEMS wafer may be displaced from the electrode position of the mounting substrate due to heat stress. However, in the LTCC, a material having a thermal expansion coefficient similar to that of silicon has been developed merely for a special application. The LTCC material conventionally provided by the present inventors has a thermal expansion coefficient of 5.5 ppm/° C., which is smaller than 7 ppm/° C. of the high temperature co-fired ceramics (HTCC) but is not a sufficient value for use in a wafer-level mounting substrate for MEMS. The present inventors further conducted research and development, and newly provided an LTCC that can be subjected to the anodic-bonding and has a thermal expansion coefficient similar to that of silicon in 2007.

This material is composed of $Na_2O$—$Al_2O_3$—$B_2O_3$—$SiO_2$ based glass and ceramic powder, and the thermal expansion coefficient thereof is adjusted to 3.3 ppm/° C. which is close to the same as that of silicon. Further, Na ions are used as conductive ions during anodic bonding, and it was also confirmed that the material can be bonded under the conditions of a temperature set at 400° C. and applying a voltage of 600 VDC. While a prototype was made and investigated with this substrate, the following findings (a) to (b) were obtained.

(a) A low anodic bonding temperature is desired due to the little influence on the MEMS. It was found that the reduction in temperature can be realized by changing the conductive ions during anodic bonding from Na ions to Li ions having a smaller ion radius.

(b) While a prototype was made, it was found that a thin substrate with a large diameter is likely to crack and has an unstable handling property, and a material with high strength is required.

DISCLOSURE OF THE INVENTION

Thus, the present invention is based on the above findings (a) to (b), and an object of the present invention is to provide an LTCC that can be subjected to the anodic-bonding at low temperature and has a transverse strength higher than that of conventional low-thermal-expansion LTCC.

More specifically, the present invention provides a low-temperature fired high-strength low-thermal-expansion porcelain that can be subjected to the anodic-bonding at low temperature, and a composition for the porcelain as follows:

1. An anodic bondable low-temperature fired porcelain having high-strength and low-thermal-expansion, wherein a conductive ion during anodic bonding is an Li ion, containing a complex oxide having a composition represented by the following formula (1):

$$(1-x)(\alpha Li_2O\text{-}\beta MgO\text{-}\gamma Al_2O_3\text{-}\delta Si_2O_2).xBi_2O_3 \qquad (1)$$

where x represents a mass ratio of 0.01 to 0.1, and α, β, γ and δ have a molar ratio of 2 to 5:1 to 2:1 to 2:7 to 17.

2. The low-temperature fired porcelain having high-strength and low-thermal-expansion that is anodic bondable with silicon according to 1 above, including a complex oxide having a composition represented by formula (1):

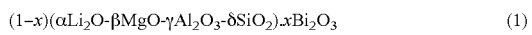
$$(1-x)(\alpha Li_2O\text{-}\beta MgO\text{-}\gamma Al_2O_3\text{-}\delta SiO_2).xBi_2O_3 \qquad (1)$$

where x represents a mass ratio of 0.01 to 0.1, and α, β, γ and δ have a molar ratio of 2 to 5:1 to 2:1 to 2:7 to 17.

3. The low-temperature fired porcelain having high-strength and low-thermal-expansion that is anodic bondable with silicon according to 1 or 2 above, in which the low-temperature fired high-strength low-thermal-expansion porcelain has a transverse strength of 150 MPa or more.

4. A composition for a low-temperature fired porcelain having high-strength and low-thermal-expansion, comprising:

(A) 90 to 99 mass % of a mixture of $Li_2O$ or a lithium compound (a1) to be oxidized to $Li_2O$ when fired, MgO or a magnesium compound (a2) to be oxidized to MgO when fired, $Al_2O_3$ (a3), and $SiO_2$ (a4) where a molar ratio of a1, a2, a3 and a4 is in a range of 2 to 5:1 to 2:1 to 2:7 to 17; and (B) 1 to 10 mass % $Bi_2O_3$, which composition produces an anodic bondable porcelain containing a complex oxide having a composition represented by the following formula (1):

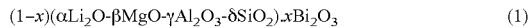
$(1-x)(\alpha Li_2O-\beta MgO-\gamma Al_2O_3-\delta SiO_2) \cdot xBi_2O_3$ (1)

where x represents a mass ratio of 0.01 to 0.1, and α, β, γ and δ have a molar ratio of 2 to 5:1 to 2:1 to 2:7 to 17 by means of heating at a temperature of 850 to 900° C.

5. The composition for a low-temperature fired porcelain having high-strength and low-thermal-expansion according to 4 above, in which the lithium compound to be oxidized to Li$_2$O when fired is lithium carbonate.

6. The composition for a low-temperature fired porcelain having high-strength and low-thermal-expansion according to 4 above, in which the magnesium compound to be oxidized to MgO when fired is one of magnesium hydroxide and magnesium carbonate.

7. The composition for a low-temperature fired porcelain having high-strength and low-thermal-expansion according to 4 above, comprising a β-spodumene that is a complex oxide of Li$_2$O, Al$_2$O$_3$ and SiO$_2$ as a part of the mixture.

8. An anodic bondable porcelain, comprising a complex oxide obtained by firing the composition for a low-temperature fired porcelain having high-strength and low-thermal-expansion according to any one of 4 to 7 above at a temperature of 850 to 900° C., which complex oxide has a composition represented by the following formula (1):

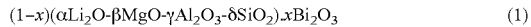
$(1-x)(\alpha Li_2O-\beta MgO-\gamma Al_2O_3-\delta SiO_2) \cdot xBi_2O_3$ (1)

where x represents a mass ratio of 0.01 to 0.1, and α, β, γ and δ have a molar ratio of 2 to 5:1 to 2:1 to 2:7 to 17.

9. A green sheet comprising the composition for a low-temperature fired porcelain having high-strength and low-thermal-expansion according to any one of 4 to 7 above and an organic binder.

10. A fired substrate formed by molding and firing the composition for a low-temperature fired high-strength low-thermal-expansion porcelain according to any one of 4 to 7 above, which has a thermal expansion coefficient of 0 to 5.0 ppm/° C.

11. A through wiring substrate using one or a plurality of green sheets according to 9 above.

12. An MEMS element formed by anodic bonding the through wiring substrate according to 11 above to a silicon wafer with an MEMS element formed thereon, followed by dicing.

EFFECTS OF THE INVENTION

The present invention enables to provide an LTCC which
(1) can be subjected to the anodic-bonding even at a low temperature of 350° C. or less,
(2) has a transverse strength higher than that of a conventional low-thermal-expansion LTCC,
(3) has less influence on MEMS, and
(4) resists cracking even if an LTCC is a thin substrate having a large diameter and has a satisfactory handling property can be provided.

BEST MODE FOR CARRYING OUT THE INVENTION

Figure 1:
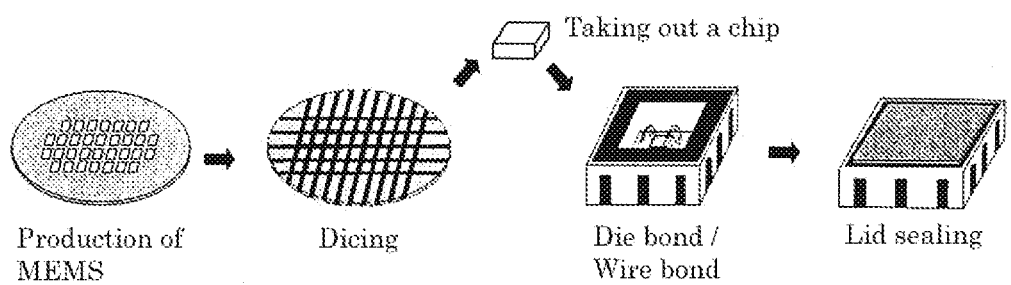
FIG. 1 is a chart showing a package mounting process.
Figure 2:
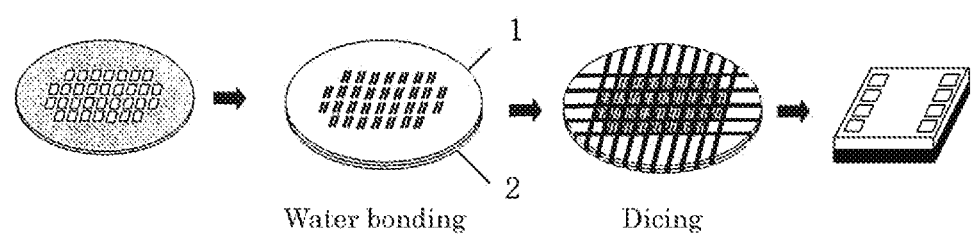
FIG. 2 is a chart showing a wafer-level mounting process.

The present invention relates to an anodic bondable low-temperature fired porcelain having high-strength and low-thermal-expansion, wherein a conduction ion during anodic bonding is an Li ion, containing a complex oxide having a composition represented by Formula (1) above.

The anodic bonding is a technology of enabling bonding to GaAs, Kovar, Al, Ti and the like, as well as silicon, and is not particularly limited in the present invention as well.

The temperature for anodic bonding is preferably low (i.e., 350° C. or less) because it lessens impact on MEMS. For example, a bonding temperature range of 300 to 330° C. or lower than 300° C. is particularly preferred. Lowering temperature has been realized by changing conductive ions during anodic bonding from Na to Li having a smaller ion radius.

Regarding the transverse strength, particularly preferred is a material with high strength having a satisfactory handling property because even when the material is formed into a thin substrate with a large diameter, it resists cracking. The present invention enables to provide a low-temperature fired porcelain having high-strength, low-thermal-expansion and a transverse strength higher than that of a low-thermal-expansion LTCC developed so far. More specifically, the transverse strength is preferably 150 to 200 MPa, more preferably 200 to 300 MPa, and particularly preferably 300 to 350 MPa or more.

A composition for an anodic bondable low-temperature fired porcelain having high-strength and low-thermal-expansion of the present invention contains 90 to 99 mass % of a mixture (A) and 1 to 10 mass % of Bi$_2$O$_3$ (B) and generates a porcelain containing a complex oxide having a composition represented by Formula (I) when fired at a temperature of 850 to 900° C.

As a lithium compound to be oxidized to Li$_2$O when fired, lithium carbonate is preferred.

As a magnesium compound to be oxidized to MgO when fired, magnesium hydroxide or magnesium carbonate is preferred.

β-spodumene that is a complex oxide of Li$_2$O, Al$_2$O$_3$ and SiO$_2$ may be contained as a part of the mixture.

Further, considering the problem such as displacement from a counterpart material due to thermal expansion during the anodic bonding, the thermal expansion behavior of the composition for porcelain for a fired substrate of the present invention needs to be similar to that of the counterpart material. In this respect, the thermal expansion coefficient of the material obtained by molding and firing the composition of the present invention is preferably within 0.5% of the thermal expansion coefficient of the counterpart material. The composition of the present invention can be a composition for porcelain which enables bonding to GaAs, Kovar, Al, Ti and the like, as well as silicon, as a counterpart material in anodic bonding. In the case where the counterpart material is silicon, the thermal expansion coefficient of the composition of the present invention is 0 to 5.0 ppm/° C., preferably 3.0 to 4.0 ppm/° C., more preferably 3.2 to 3.8 ppm/° C., and particularly preferably 3.2 to 3.5 ppm/° C.

The composition for porcelain described above can be formed into a green sheet by being complexed with an organic binder.

The green sheet of the present invention can be produced by an ordinary method. For example, a solvent such as toluene or isopropyl alcohol is added to the mixed powder obtained by calcining and crushing a material powder made of the above composition, to thereby disperse the mixture in a ball mill. Then, for example, 1 to 20 parts by mass of an organic binder such as polyvinyl alcohol, 1 to 10 parts by mass of a plasticizer (e.g., dibutylphthalate), and if required, a dispersant and the like are added to 100 parts by mass in total of inorganic powder, and the mixture is dispersed to produce a slurry. The slurry thus obtained is molded into a sheet by molding according to a doctor blade method and the like, followed by drying, whereby a green sheet is obtained. The thickness of the green sheet may be designed depending on the intended use or the like, and generally is about 80 to 150 μm.

After holes are punched the obtained green sheet by punching or the like, a circuit is printed and an opened via-hole is filled with a conductive paste. If required, a plurality of green sheets are laminated, and thereafter, subjected to ordinary treatments such as a binder-removal treatment and a firing treatment, whereby a through wiring substrate can be obtained. Regarding the firing, the green sheets and the conductor are co-fired at a low temperature of 850 to 900° C.

The obtained through wiring substrate is bonded to a silicon wafer with various kinds of MEMS elements formed thereon by anodic bonding and subjected to dicing and the like to produce an MEMS device. The production of the silicon wafer with the MEMS elements formed thereon and the anodic bonding can be performed by ordinary methods.

Regarding the thermal expansion coefficient of the substrate, the thermal expansion coefficient of a molded and fired material is preferably within 0.5% of the thermal expansion coefficient of a counterpart material as described above. In the case where the counterpart material for anodic bonding is silicon, the thermal expansion coefficient is 0 to 5.0 ppm/° C., and preferably 3.0 to 4.0 ppm/° C.

[Composition for Porcelain and Porcelain of the Present Invention]

The composition for an anodic bondable low-temperature fired porcelain having high-strength and low-thermal-expansion of the present invention comprises:

(A) 90 to 99 mass % of a mixture of $Li_2O$ or a lithium compound (a1) to be oxidized to $Li_2O$ when fired, MgO or a magnesium compound (a2) to be oxidized to MgO when fired, $Al_2O_3$ (a3) and $SiO_2$ (a4) where a molar ratio of a1, a2, a3 and a4 is in a range of 2 to 5:1 to 2:1 to 2:7 to 17; and (B) 1 to 10 mass % of $Bi_2O_3$;

and generates an anodic bondable low-temperature fired porcelain having high-strength and low-thermal-expansion, containing a complex oxide having a composition represented by the following formula (1):

$$(1-x)(\alpha Li_2O\text{-}\beta MgO\text{-}\gamma Al_2O_3\text{-}\delta SiO_2)\cdot xBi_2O_3 \quad (1)$$

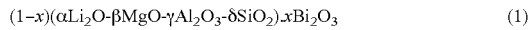

when fired at a temperature of 850 to 900° C.
where x represents a mass ratio of 0.01 to 0.1, and $\alpha$, $\beta$, $\gamma$ and $\delta$ have a molar ratio of 2 to 5:1 to 2:1 to 2:7 to 17.

In the above composition range, the range of a mass ratio x is 0.01 to 0.1. When x is less than 0.01, the composition is not sintered. When x is more than 0.1, the composition is melted.

In a molar ratio, $\alpha$ to $\delta$ are in the following ranges.
α: 2 to 5
β: 1 to 2
γ: 1 to 2
δ: 7 to 17.

When α is less than 2, the composition is not sintered, and when α is more than 5, the composition is melted. When β is less than 1, the composition is not sintered, and when β is more than 2, the thermal expansion of the composition increases. When γ is less than 1, the thermal expansion increases, and when γ is more than 2, the composition is not sintered. When δ is short of or beyond the range of 7 to 17, the composition is not sintered.

By firing material powder made of the above composition at a low temperature to form a complex oxide, an anodic bondable low-temperature fired porcelain having high-strength and low-thermal-expansion of the present invention can be obtained.

The anodic bondable low-temperature fired porcelain having high-strength and low-thermal-expansion of the present invention is a porcelain comprising a complex oxide having a composition represented by the following formula (1):

$$(1-x)(\alpha Li_2O\text{-}\beta MgO\text{-}\gamma Al_2O_3\text{-}\delta SiO_2)\cdot xBi_2O_3 \quad (1)$$

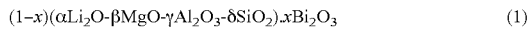

where x represents a mass ratio of 0.01 to 0.1, and $\alpha$, $\beta$, $\gamma$ and $\delta$ have a molar ratio of 2 to 5:1 to 2:1 to 2:7 to 17.

By allowing the above mixture containing Li, Mg, Al and Si to contain $Bi_2O_3$, a $Bi_2O_3$—$SiO_2$ based liquid phase or a glass phase is formed during heating, and the composition can be fired at a low temperature of about 850 to 900° C. via the liquid phase reaction.

Thus, the anodic bondable low-temperature fired porcelain having high-strength and low-thermal-expansion of the present invention mainly comprises a β-spodumene based crystal phase and/or an $Li_2O$—$Al_2O_3$—$SiO_2$ based crystal phase, an $Li_2O$—$SiO_2$ based crystal phase, and a MgO—$SiO_2$ based crystal phase as major components, and further a $Bi_2O_3$—$SiO_2$ based crystal phase and/or a glass phase.

Herein, the "β-spodumene based crystal phase" refers to a β-spodumene crystal and a crystal phase with a composition and a crystal structure similar thereto; the "$Li_2O$—$Al_2O_3$—$SiO_2$ based crystal phase" refers to an $Li_2O$—$Al_2O_3$—$SiO_2$ crystal and a crystal phase with a composition and a crystal structure similar thereto; and the "$Li_2O$—$SiO_2$ based crystal phase" refers to an $Li_2O$—$SiO_2$ crystal and a crystal phase with a composition and a crystal structure similar thereto. Each crystal phase may contain a crystal with the same type of crystal structure containing elements other than the main constituent elements constituting each of the above-mentioned crystals.

The above also applies to the MgO—$SiO_2$ based crystal phase and the $Bi_2O_3$—$SiO_2$ based crystal phase. The "MgO—$SiO_2$ based crystal phase" refers to an MgO—$SiO_2$ crystal and a crystal phase with a composition and a crystal structure similar thereto; and the "$Bi_2O_3$—$SiO_2$ based crystal phase" refers to a $Bi_2O_3$—$SiO_2$ crystal and a crystal phase with a composition and a crystal structure similar thereto. Each crystal phase may contain a crystal with the same type of crystal structure containing elements other than the main constituent elements constituting each of the above-mentioned crystals.

The specific content ratio of each crystal phase is not particularly limited as long as it realizes the intended physical properties, and generally, the β-spodumene based crystal phase and/or $Li_2O$—$Al_2O_3$—$SiO_2$ based crystal phase, the $Li_2O$—$SiO_2$ based crystal phase, and the MgO—$SiO_2$ based crystal phase are contained in a ratio of 90% or more, preferably 95% or more of the entire volume of the porcelain.

The anodic bondable low-temperature fired porcelain having high-strength and low-thermal-expansion of the present invention has a linear thermal expansion coefficient of 0 to 5×ppm/° C., a transverse strength of 150 MPa or more, preferably 300 MPa or more, and is densified to a relative density of 95% or more by firing at a low temperature in the range of 850 to 900° C.

[Method of Producing Porcelain of Present Invention]

The anodic bondable low-temperature fired porcelain having high-strength and low-thermal-expansion of the present invention can be produced by calcining at 750 to 850° C. the material powder made of the above composition, followed by crushing, adding thereto a molding assistant containing a binder to mold the powder into a predetermined shape, and firing the molded product at a low temperature of 850 to 900° C. to form a complex oxide.

$Li_2O$ or a lithium compound to be oxidized to $Li_2O$ when fired, MgO or a magnesium compound to be oxidized to MgO when fired, $Al_2O_3$ and $SiO_2$, which are main materials, may be a mixture of each metal oxide, or a mixture in which requirements of MgO and $Bi_2O_3$ are mixed with a complex oxide such as β-spodumene. $Li_2O$ or a lithium compound to be oxidized to $Li_2O$ when fired, MgO or a magnesium compound to be oxidized to MgO when fired, $Al_2O_3$ and $SiO_2$, that can be used as starting materials, can be added not only in the form of the oxide powder of each metal, but also in the form of a salt capable of forming an oxide during the firing step, such as carbonate, acetate or nitrate, or in the form of a hydroxide such as lithium carbonate ($Li_2CO_3$), magnesium carbonate ($MgCO_3$) or magnesium hydroxide ($Mg(OH)_2$).

$Bi_2O_3$ powder is added as a firing assistant to the main materials so that the main materials are preferably in the range of 90 to 99% by mass and $Bi_2O_3$ is in the range of 1 to 10% by mass.

It is desired that the material powder such as $Li_2CO_3$, MgO, $Al_2O_3$, $SiO_2$ and $Bi_2O_3$ be fine powder with a diameter of 2.0 μm or less, in particular, 1.0 μm or less so as to enhance dispersibility and obtain desired strength and low thermal expansion.

A binder (preferably, an organic binder such as an acrylic resin binder), a plasticizer (e.g., a polyester resin such as dibutylphthalate (DBP)), and if required, an organic solvent such as toluene and methyl ethyl ketone (MEK) are appropriately added to the mixed powder prepared by adding and mixing the components in the above ratio, followed by calcining at 750 to 850° C. and crushing. Then, the resultant powder is molded into an arbitrary shape, for example by press molding, extrusion molding, a doctor blade method, a rolling method or the like. The molded product thus obtained is fired at a temperature of 850 to 900° C. for one to three hours in an oxidizing atmosphere or a non-oxidizing atmosphere of $N_2$, Ar or the like, whereby the molded product can be densified to a relative density of 95% or more.

When the firing temperature at this time is lower than 850° C., the porcelain is not sufficiently densified. When the firing temperature exceeds 900° C., although the porcelain can be densified, it becomes difficult to use a conductor with a low melting point such as Ag, Au and Cu as a wiring material.

In the present invention, as a result of the active liquid-solid reaction between a solid phase that is a complex oxide of Li, Mg, Al and Si and a $Bi_2O_3$—$SiO_2$ based liquid phase, the porcelain can be densified with a small amount of a firing assistant. Therefore, the amount of an amorphous phase can be minimized.

Thus, according to the present invention, the spodumene based crystal phase containing at least Li, Al and Si; and/or the $Li_2O$—$Al_2O_3$—$SiO_2$ based crystal phase, the $Li_2O$—$SiO_2$ based crystal phase, the MgO—$SiO_2$ based crystal phase and the $Bi_2O_3$—$SiO_2$ based crystal phase are precipitated in the porcelain fired at a low temperature, whereby a low-thermal-expansion porcelain with high strength can be obtained.

EXAMPLES

Hereinafter, the present invention will be described in more detail by way of examples and comparative examples. However, the present invention is not limited thereto.

Examples 1 to 9

$Li_2CO_3$, MgO, $Al_2O_3$, $SiO_2$ and $Bi_2O_3$ with an average particle size of 1 μm or less were mixed so that a content ratio in the oxide conversion became to that as shown in Table 1, and the mixture was calcined at 750 to 850° C. and crushed to obtain powder. An organic binder, a plasticizer and toluene were added to the calcined product to form a green sheet with a thickness of 150 μm by a doctor blade method. Then, five green sheets were laminated, and thermally compressed under a pressure of 150 kg/cm² at a temperature of 70° C. The thus-obtained laminated body was subjected to binder-removal in the air at 500° C., thereby to obtain a multi-layered substrate made of a porcelain fired in the air under the conditions as in Table 1.

Nine levels of the substrates densified (water absorption: zero) at a firing temperature of 850 to 900° C. were prepared to evaluate the anodic bonding performance. Each of the nine levels of the substrates was diced to a 20 mm square and mirror-polished to a plate thickness of 0.3 mm. The substrate and silicon were bonded with anodic bonding by applying a D.C. voltage (600 VDC) thereto on a hot plate so that silicon functioned as a positive electrode and the substrate functioned as a negative electrode. A resistive element for detecting a voltage was inserted to a circuit made by the anodic bonding, and the voltage applied to the resistive element was monitored, and the change in a bonding current with the passage of bonding was checked. As a result, the circuits showed the same bonding current behavior as that in the case where a glass substrate and silicon were bonded with anodic-bonding.

The bulk density (g/cm³) of the fired body was measured by an Archimedes method. Further, the 3-point bending strength (transverse strength MPa) of the porcelain was measured according to JIS R 1601. Further, the surface roughness (nmRa) was measured by a non-contact surface roughness measuring device (manufactured by Taylor Hobson K.K.) was measured. Table 1 shows the measurement results.

TABLE 1

| | Main phase | | | | | Assistant $Bi_2O_3$ | Sheet | | |
|---|---|---|---|---|---|---|---|---|---|
| Example | wt % 1 − X | $Li_2O$ α | MgO β | $Al_2O_3$ γ | $SiO_2$ δ | wt % X | Bulk density g/cm³ | Transverse strength MPa | Surface roughness nmRa |
| 1 | 95 | 2 | 2 | 1 | 9 | 5 | 2.63 | 253 | 3.34 |
| 2 | 95 | 2 | 2 | 1 | 9 | 5 | 2.63 | 273 | 2.81 |
| 3 | 97 | 3 | 1 | 2 | 9 | 3 | 2.49 | 232 | 3.02 |
| 4 | 95 | 2 | 1 | 1 | 9 | 5 | 2.56 | 312 | 3.21 |
| 5 | 90 | 2 | 1 | 1 | 9 | 10 | 2.62 | 201 | 13.37 |
| 6 | 95 | 4 | 1 | 2 | 9 | 5 | 2.54 | 282 | 3.53 |
| 7 | 95 | 3 | 1 | 2 | 12 | 5 | 2.49 | 172 | 3.30 |
| 8 | 95 | 3 | 1 | 2 | 15 | 5 | 2.42 | 166 | 58.63 |

TABLE 1-continued

| | Main phase | | | | Assistant Bi$_2$O$_3$ | Sheet | | |
|---|---|---|---|---|---|---|---|---|
| Example | wt % 1 − X | Li$_2$O α | MgO β | Al$_2$O$_3$ γ | SiO$_2$ δ | wt % X | Bulk density g/cm$^3$ | Transverse strength MPa | Surface roughness nmRa |
| 9 | 99 | 2 | 1 | 1 | 9 | 1 | 2.47 | 159 | 2.80 |

(Note):
"Surface roughness" refers to an average value of surface roughness at eight points in X and Y directions on front and back surfaces of two substrates.

Since the anodic bonding is direct bonding, the surface roughness of a substrate is very important. Although the surface roughness of the fired substrate is about 200 nmRa, the surface roughness can be set to be preferably 2.8 to 3.6 nmRa, which is equivalent to that of Pyrex glass, by improving the mirror polishing treatment level.

The anodic bonding was conducted at 300° C., 330° C. and 360° C. using the mirror-polished substrate.

The obtained junction body by anodic bonding was scratched with a glass cutter to be divided manually, and the cut-out surface was observed with a scanning electron microscope (SEM). Consequently, it was found that silicon and the substrate fired at a low temperature formed a continuous surface on the cut-out surface without any discontinuous points (delamination), and thus, the junction body was tightly bonded (rated as "pass" in Tables). Table 2 shows the results.

TABLE 2

| | Delamination check | | |
|---|---|---|---|
| Example | 300° C. | 330° C. | 360° C. |
| 1 | — | Pass | Pass |
| 2 | — | Pass | Pass |
| 3 | Pass | Pass | Pass |
| 4 | Pass | Pass | Pass |
| 5 | Pass | Pass | Pass |
| 6 | Pass | Pass | Pass |
| 7 | Pass | Pass | Pass |
| 8 | Pass | Pass | Pass |

As shown in Table 2, all the substrates in Examples 1 to 9 were bonded with anodic bonding even at a low temperature of 350° C. or lower.

Comparative Example 1

For comparison, using low-temperature fired ceramics (BSW) employing Na as conductive ions during the anodic bonding, the delamination in a junction body made by anodic bonding of the low-temperature fired ceramics and silicon was observed in the same way as the above. Table 3 shows the results. The LTCC (BSW) for comparison was produced as follows. Commercially available glass which can be subjected to anodic-bonding (81.9 to 82.4 mass % of SiO$_2$; 2.9 to 3.2 mass % of Al$_2$O$_3$; 10.5 to 11.0 mass % of B$_2$O$_3$; 3.9 to 4.7 mass % Na$_2$O; 0.1 mass % or less each of K$_2$O, Fe$_2$O$_3$, CaO, and MgO) was crushed to have an average particle size (D50) of 0.6 to 2.5 μm, and mixed with alumina powder with an average particle size of 1 to 3 μm and cordierite powder (glass recrystallized type) with an average particle size of 1 to 3 μm. Toluene as a solvent was added to the mixture, and the resultant mixture was dispersed in a ball mill. After that, polyvinyl alcohol as a binder and dibutylphthalate (DBP) as a plasticizer were added to the resultant mixture to produce a slurry. The obtained slurry was molded into a sheet shape by a doctor blade method, followed by drying, to obtain a green sheet with a thickness of 125 μm. The green sheet was cut into a predetermined size, and eight green sheets were laminated and fired at 835° C. or 850° C. for one hour in the atmosphere, whereby a low-temperature-fired ceramics (BSW) using Na as conductive ions during anodic bonding was produced. The substrate (BSW) failed in anodic-bonding at 330° C. (rated as "fail" in Table 3).

TABLE 3

| Comparative | | Delamination check | | | |
|---|---|---|---|---|---|
| Example | Substrate | 330° C. | 360° C. | 380° C. | 400° C. |
| 1 | BSW | Fail | Pass | Pass | Pass |

As is illustrated above, compared with the conventional low-temperature-fired ceramics (LTCC) using Na ions as conductive ions during anodic bonding, the present invention enables to perform anodic bonding even at low temperature of 350° C. or less by using Li ions as conductive ions during anodic bonding. Further, the present invention can provide the LTCC having a transverse strength higher than that of conventional low-thermal-expansion LTCC.

INDUSTRIAL APPLICABILITY

The present invention enables to provide an anodic bondable low-temperature fired porcelain having high-strength and low-thermal-expansion and a composition for the porcelain. A wiring substrate obtained by molding and firing the composition is particularly suitable as an hermetically-sealed through wiring substrate of the micro electromechanical systems (MEMS). An MEMS element obtained by wafer-level packaging using the hermetically-sealed through wiring substrate can be provided.

The invention claimed is:
1. An anodic bondable low-temperature fired porcelain having high-strength and low-thermal-expansion, wherein a conductive ion during anodic bonding is an Li ion, containing a complex oxide having a composition represented by the following formula (1):

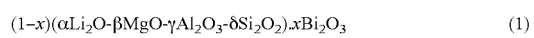

$$(1-x)(\alpha Li_2O \text{-} \beta MgO \text{-} \gamma Al_2O_3 \text{-} \delta SiO_2) \cdot x Bi_2O_3 \qquad (1)$$

where x represents a mass ratio of 0.01 to 0.1, and α, β, γ and δ have a molar ratio of 2 to 5:1 to 2:1 to 2:7 to 17.

2. The low-temperature fired porcelain having high-strength and low-thermal-expansion according to claim 1 that is anodic bondable with silicon, including a complex oxide having a composition represented by formula (1):

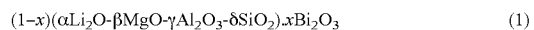

$$(1-x)(\alpha Li_2O \text{-} \beta MgO \text{-} \gamma Al_2O_3 \text{-} \delta SiO_2) \cdot x Bi_2O_3 \qquad (1)$$

where x represents a mass ratio of 0.01 to 0.1, and α, β, γ and δ have a molar ratio of 2 to 5:1 to 2:1 to 2:7 to 17.

3. The low-temperature fired porcelain having high-strength and low-thermal-expansion according to claim 1 that is anodic bondable with silicon, in which the low-temperature fired high-strength low-thermal-expansion porcelain has a transverse strength of 150 MPa or more.

4. A composition for a low-temperature fired porcelain having high-strength and low-thermal-expansion, comprising:
  (A) 90 to 99 mass % of a mixture of $Li_2O$ or a lithium compound (a1) to be oxidized to $Li_2O$ when fired, MgO or a magnesium compound (a2) to be oxidized to MgO when fired, $Al_2O_3$ (a3), and $SiO_2$ (a4) where a molar ratio of a1, a2, a3 and a4 is in a range of 2 to 5:1 to 2:1 to 2:7 to 17; and
  (B) 1 to 10 mass % $Bi_2O_3$,
which composition produces an anodic bondable porcelain containing a complex oxide having a composition represented by the following formula (1):

$$(1-x)(\alpha Li_2O\text{-}\beta MgO\text{-}\gamma Al_2O_3\text{-}\delta SiO_2)\cdot xBi_2O_3 \quad (1)$$

where x represents a mass ratio of 0.01 to 0.1, and α, β, γ and δ have a molar ratio of 2 to 5:1 to 2:1 to 2:7 to 17 by means of heating at a temperature of 850 to 900° C.

5. The composition for a low-temperature fired porcelain having high-strength and low-thermal-expansion according to claim 4, in which the lithium compound to be oxidized to $Li_2O$ when fired is lithium carbonate.

6. The composition for a low-temperature fired porcelain having high-strength and low-thermal-expansion according to claim 4, in which the magnesium compound to be oxidized to MgO when fired is one of magnesium hydroxide and magnesium carbonate.

7. The composition for a low-temperature fired porcelain having high-strength and low-thermal-expansion according to claim 4, comprising a β-spodumene that is a complex oxide of $Li_2O$, $Al_2O_3$ and $SiO_2$ as a part of the mixture.

8. An anodic bondable porcelain, comprising a complex oxide obtained by firing the composition for a low-temperature fired porcelain having high-strength and low-thermal-expansion according to claim 4 at a temperature of 850 to 900° C., which complex oxide has a composition represented by the following formula (1):

$$(1-x)(\alpha Li_2O\text{-}\beta MgO\text{-}\gamma Al_2O_3\text{-}\delta SiO_2)\cdot xBi_2O_3 \quad (1)$$

where x represents a mass ratio of 0.01 to 0.1, and α, β, γ and δ have a molar ratio of 2 to 5:1 to 2:1 to 2:7 to 17.

9. A green sheet comprising the composition for a low-temperature fired porcelain having high-strength and low-thermal-expansion according to claim 4 and an organic binder.

10. A fired substrate formed by molding and firing the composition for a low-temperature fired high-strength low-thermal-expansion porcelain according to claim 4, which has a thermal expansion coefficient of 0 to 5.0 ppm/° C.

11. A through wiring substrate using one or a plurality of green sheets according to claim 9.

12. An MEMS element formed by anodic bonding the through wiring substrate according to claim 11 to a silicon wafer with an MEMS element formed thereon, followed by dicing.

* * * * *